(12) United States Patent
Cho et al.

(10) Patent No.: US 12,438,010 B2
(45) Date of Patent: Oct. 7, 2025

(54) APPARATUS FOR COLLECTING BY-PRODUCT FOR SEMICONDUCTOR MANUFACTURING PROCESS WITH IMPROVED COLLECTION SPACE EFFICIENCY

(71) Applicant: MILAEBO CO., LTD., Pyeongtaek-si (KR)

(72) Inventors: Che Hoo Cho, Seoul (KR); Yeon Ju Lee, Hwaseong-si (KR); Ji Eun Han, Pyeongtaek-si (KR); Woo Yeon Won, Pyeongtaek-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 338 days.

(21) Appl. No.: 18/364,371

(22) Filed: Aug. 2, 2023

(65) Prior Publication Data
US 2024/0321595 A1  Sep. 26, 2024

(30) Foreign Application Priority Data
Mar. 23, 2023 (KR) .................. 10-2023-0037811

(51) Int. Cl.
*B01D 53/00* (2006.01)
*H01L 21/67* (2006.01)

(52) U.S. Cl.
CPC ...... *H01L 21/67017* (2013.01); *B01D 53/005* (2013.01); *H01L 21/67098* (2013.01); *B01D 2258/0216* (2013.01)

(58) Field of Classification Search
CPC ......... H01L 21/67017; H01L 21/67098; H01L 21/67011; B01D 53/005; B01D 2258/0216
See application file for complete search history.

(56) References Cited

U.S. PATENT DOCUMENTS

| 7,988,755 B2 * | 8/2011 | Cho .................... C23C 16/4412 |
| | | 55/DIG. 15 |
| 11,555,243 B2 * | 1/2023 | Cho .................... C23C 16/4412 |
| | (Continued) | |

FOREIGN PATENT DOCUMENTS

| KR | 10-0717837 B1 | 5/2007 |
| KR | 10-0862684 B1 | 10/2008 |
| | (Continued) | |

*Primary Examiner* — Dung H Bui
(74) *Attorney, Agent, or Firm* — You & IP, LLC

(57) ABSTRACT

The present disclosure relates to an apparatus for collecting by-products for a semiconductor manufacturing process with improved collection space efficiency, and an object of the present disclosure is to provide an apparatus for collecting by-products, which provides a multi-stage collection function while guiding a flow of exhaust gas through an internal collection tower, which includes an upper-end collection part, an intermediate collection part, and a lower-end collection part by guiding the exhaust gas to a lower side through a peripheral portion after heating the exhaust gas, which is introduced into the collection apparatus, by using a heater, and allows main by-products to be accumulated in an internal space of the intermediate collection part having open gas flow structures of an inner region and an inner wall housing, thereby improving efficiency of a collection space.

9 Claims, 7 Drawing Sheets

(56) References Cited

U.S. PATENT DOCUMENTS

| | | | |
|---|---|---|---|
| 11,623,175 B1* | 4/2023 | Cho | H01J 37/32844 |
| | | | 423/210 |
| 2009/0217634 A1* | 9/2009 | Choi | H01L 21/67017 |
| | | | 55/428.1 |
| 2019/0194804 A1* | 6/2019 | Cho | H01L 21/67098 |
| 2020/0164296 A1* | 5/2020 | Cho | B01D 45/16 |
| 2020/0217559 A1* | 7/2020 | Hwang | F24H 3/00 |
| 2020/0321226 A1* | 10/2020 | Cho | C23C 16/4412 |
| 2021/0039034 A1* | 2/2021 | Cho | B01D 45/08 |
| 2021/0053002 A1* | 2/2021 | Cho | B01D 45/06 |
| 2021/0134621 A1* | 5/2021 | Cho | C23C 16/4412 |
| 2021/0134701 A1* | 5/2021 | Cho | H01L 23/473 |
| 2022/0143543 A1* | 5/2022 | Maeng | B01D 45/08 |
| 2022/0228261 A1* | 7/2022 | Cho | C23C 16/4412 |
| 2022/0349052 A1* | 11/2022 | Cho | C23C 16/405 |
| 2022/0349053 A1* | 11/2022 | Cho | H01J 37/32871 |
| 2022/0410047 A1* | 12/2022 | Cho | H01L 21/67069 |
| 2023/0277972 A1* | 9/2023 | Cho | B01D 45/08 |
| 2023/0311051 A1* | 10/2023 | Cho | B01D 50/20 |
| | | | 55/315.1 |

FOREIGN PATENT DOCUMENTS

| | | |
|---|---|---|
| KR | 10-1447629 B1 | 10/2014 |
| KR | 10-1806480 B1 | 1/2018 |
| KR | 10-2311939 B1 | 10/2021 |
| KR | 10-2416322 B1 | 7/2022 |
| KR | 10-2023-0000203 A | 1/2023 |

* cited by examiner

APPARATUS FOR COLLECTING BY-PRODUCT FOR SEMICONDUCTOR MANUFACTURING PROCESS WITH IMPROVED COLLECTION SPACE EFFICIENCY

CROSS-REFERENCE TO RELATED APPLICATIONS

This application claims the priority of Korean Patent Application No. 10-2023-0037811 filed on Mar. 23, 2023, in the Korean Intellectual Property Office, the disclosure of which is incorporated herein by reference.

BACKGROUND

Field

The present disclosure relates to an apparatus for collecting by-products for a semiconductor manufacturing process with improved collection space efficiency, and more particularly, to a collection apparatus provided with an internal collection tower having an exhaust gas guide flow and a structure capable of accommodating by-products collected in an internal space in order to increase a usage cycle by collecting, with higher efficiency, by-products, which are contained in exhaust gas components discharged from a process chamber due to a change in various semiconductor manufacturing processes, in a limited collection space.

Description of the Related Art

In general, semiconductor manufacturing processes broadly include a pre-process (fabrication process) and a post-process (assembly process). The pre-process refers to a process of manufacturing semiconductor chips by processing specific patterns by repeatedly performing a procedure of depositing thin films on wafers in various types of process chambers and a procedure of selectively etching the deposited thin films. The post-process refers to a process of individually separating the chips manufactured in the pre-process and then assembling finished products by combining the chips and lead frames.

In this case, the process of depositing a thin-film on the wafer or the process of etching the thin-film deposited on the wafer is performed at a high temperature by injecting reactant gases and precursors such as silane, arsine, boron chloride, and hydrogen into a process chamber through a gas injection system. During the process, various types of ignitable gases, corrosive foreign substances, and harmful gases containing toxic components are produced in large amount in the process chamber.

In order to purify and discharge the harmful gas, a scrubber is installed at a rear end of a vacuum pump that establishes a vacuum state in a semiconductor manufacturing process chamber, and the scrubber purifies exhaust gas discharged from the process chamber and discharges the purified gas into the atmosphere.

However, because the scrubber mainly purifies and treats only gaseous by-products, the by-product may adhere to an exhaust line when the by-product, which is discharged to the outside of the process chamber, is solidified. For this reason, there may occur problems in that exhaust pressure increases, a vacuum pump is broken down at the time of introducing the by-product by using the vacuum pump, and harmful gas reversely flows into the process chamber and contaminates a wafer.

Therefore, in most semiconductor manufacturing facilities, an apparatus for collecting by-products is installed between the process chamber and the vacuum pump to aggregate exhaust gas and collect the exhaust gas in a powder or solidified material state.

Meanwhile, depending on collection capacities, the apparatus for collecting by-products, which has a small capacity, is installed in a clean room in which a process chamber is installed, and the apparatus for collecting by-products, which has a large capacity, is installed on a lower stage on which a pump is installed. Alternatively, the apparatus for collecting by-products, which has a large capacity, is generally installed on a separate stage provided between an upper stage, on which a clean room is positioned, and a lower stage on which a pump is positioned.

The apparatuses are distinguished and installed as described above in consideration of practical installation spaces in factories that vary depending on differences in size between capacities of the collection apparatuses. In the case of a semiconductor production facility that generates a relatively small amount of exhaust gas, a collection apparatus having a small capacity, e.g., a capacity capable of collecting by-products of about 10 to 20 kg is installed in consideration of a size of a clean room, a problem of process stop during maintenance, or contamination.

Therefore, the collection apparatus having a small capacity needs to have a structure in which the introduced exhaust gas, which is not aggregated in an inlet port of a heater structure, is heated by a heater, such that the by-products are collected with high efficiency as the exhaust gas, which is introduced into the inside, stays in an internal collection tower for a maximally long period of time, and only the gaseous exhaust gas, from which the by-products are removed, is discharged through a discharge port while an outflow of the collected by-products through the discharge port is minimized.

To this end, among the collection apparatuses in the related art, the collection apparatus having a relatively small collection capacity typically has a lattice-shaped structure made by providing collection plates, which constitute an internal collection tower and have a plurality of quadrangular surfaces, so that the collection plates intersect one another to implement maximum collection efficiency because the collection apparatus has a small physical size. The collection apparatus provides complicated flow paths, through which exhaust gas flows, by providing hole structures formed in surfaces of the respective collection plates or spaces between the adjacent collection plates, thereby increasing the time for which the exhaust gas stays in the collection apparatus and aggregating the exhaust gas on the surfaces of the collection plates.

However, the collection apparatus, which has the internal collection tower having the complicated flow path structure defined by the lattice structure, in which the quadrangular surface-type collection plates densely intersect one another and the gas holes formed in the surface-type collection plates, cannot efficiently use the effective collection space in the collection apparatus because of the structure of the internal collection tower used for the above-mentioned purposes. In contrast, collection reactions are concentratedly generated on the outer collection plates or the inner collection plates of the internal collection tower in accordance with a main flow of the exhaust gas, such that the flow of the exhaust gas stagnates. For this reason, a smooth supply of exhaust gas is hardly performed, and the remaining idle collection space or the collection plate cannot be efficiently used, which causes a structural problem of deterioration in collection efficiency.

DOCUMENTS OF RELATED ART

Patent Documents (Patent Document 1) Korean Patent No. 10-1806480 (Dec. 1, 2017)
(Patent Document 2) Korean Patent No. 10-0717837 (May 7, 2007)
(Patent Document 3) Korean Patent No. 10-0862684 (Oct. 2, 2008)
(Patent Document 4) Korean Patent No. 10-1447629 (Sep. 29, 2014)

SUMMARY

An object to be achieved by the present disclosure is to provide an apparatus for collecting by-products, which provides a multi-stage collection function while guiding a flow of exhaust gas through an internal collection tower, which includes an upper-end collection part, an intermediate collection part, and a lower-end collection part by guiding the exhaust gas to a lower side through a peripheral portion after heating the exhaust gas, which is introduced into the collection apparatus, by using a heater, and allows main by-products to be accumulated in an internal space of the intermediate collection part having open gas flow structures of an inner region and an inner wall housing, thereby improving efficiency of a collection space.

Another object to be achieved by the present disclosure is to provide an apparatus for collecting by-products, in which quadrangular horizontal collection plates, which have different areas and gas holes different in sizes, shapes, and arrangements for an upper-end collection part, an intermediate collection part, and a lower-end collection part that constitute an internal collection tower, to allow collected by-products to be accumulated while regulating and guiding upward and downward flows of exhaust gas and minimize a degree to which the exhaust gas at an upper side is discharged to a lower discharge port or a degree to which the by-products are accumulated at a lower side and easily flow outward, thereby improving collection space efficiency.

According to an aspect of the present disclosure, an apparatus for collecting by-products for a semiconductor manufacturing process with improved collection space efficiency is installed in an exhaust line between a process chamber and a vacuum pump, introduces exhaust gas discharged from the processor chamber into a housing, heats and distributes the exhaust gas with a heater, and collects by-products in an internal collection tower, and the apparatus includes: the internal collection tower configured by an upper-end collection part, an intermediate collection part, and a lower-end collection part provided on multiple stages and configured to collect the by-products while changing a flow path direction of the introduced exhaust gas by maximally using a limited space in the housing, such that the by-products are mainly collected by outer peripheral vertical blade plates at an outer periphery having an open structure to allow gas to smooth flow between an inner region and an inner wall of the housing, the by-products are collected by the intermediate collection part having inner vertical blade plates and bottom plates each having a lower height than the outer peripheral vertical blade plate, and then the by-products are accumulated in an internal space of the apparatus.

In the exemplary embodiment, the upper-end collection part may include: a quadrangular first horizontal collection plate having a main gas hole and a plurality of auxiliary gas holes formed around the main gas hole and configured to collect the by-products while guiding the flow of the exhaust gas, which flows downward from the heater, to the central portion; a plurality of triangular collection plates arranged radially along an outer periphery of an upper surface of the first horizontal collection plate and configured to collect the by-products; bent-type collection plates provided at four edges of an upper surface of the first horizontal collection plate and protruding to be higher than the triangular collection plates, the bent-type collection plates being configured to collect the by-products while having an open structure so as not to hinder the introduction flow of the exhaust gas; and fastening rods protruding downward and corresponding to vertices of a bottom surface of the first horizontal collection plate, the fastening rods being fastened and fixed to an internal collection tower supports.

In the exemplary embodiment, the bent-type collection plate may include: a pair of support bodies provided at an outer periphery of the first horizontal collection plate; and a connection body configured to connect upper ends of the support bodies.

In the exemplary embodiment, the triangular collection plates may each have a right-angled triangular shape having a vertical surface positioned adjacent to the central portion, and the triangular collection plates may be positioned above the plurality of auxiliary holes arranged along the outer periphery and fastened to intersect vertical plate pieces.

In the exemplary embodiment, the intermediate collection part may include: a quadrangular second horizontal collection plate having a main gas hole formed in a central portion of a surface thereof, and a plurality of auxiliary gas holes uniformly formed and quadrangularly arranged on the entire remaining surface thereof, the second horizontal collection plate configured to collect the by-products while guiding the flow of the exhaust gas; a plurality of outer peripheral vertical blade plates arranged along an outer peripheral edge of an upper surface of the second horizontal collection plate and configured to collect the by-products with an installation structure opened so as not to block the flow of the exhaust gas between the inner wall of the housing and the inner region; a plurality of inner vertical blade plates protruding in an inner region of the upper surface of the second horizontal collection plate so as to be disposed at a height lower than the outer peripheral vertical blade plates, the plurality of inner vertical blade plates being configured to collect the by-products; bottom plates protruding in a lattice shape in the inner region of the upper surface of the second horizontal collection plate so as to be disposed at a height lower than the inner vertical blade plates, the bottom plates being configured to collect the by-products; inclined plates configured to intersect the outer peripheral vertical blade plates in a horizontal direction and installed on multiple vertical stages, the inclined plates being configured to collect the by-products while generating vortices; and spacing plates protruding downward from a bottom surface of the second horizontal collection plate and supported on the lower-end collection part, the spacing plates being configured to collect the by-products while spacing the second horizontal collection plate and the lower-end collection part at a predetermined interval.

In the exemplary embodiment, the outer peripheral vertical blade plate may have a wide lower portion and a narrow upper portion, and an outer portion directed toward the inner wall of the housing may have a shape of a vertical right-angled triangular structure, and a surface of the outer peripheral vertical blade plate may be positioned in a transverse direction without being disposed to be directed toward the central portion so that an open structure is provided between the inner wall of the housing and an inner region of the intermediate collection part.

In the exemplary embodiment, the inner vertical blade plates may each be configured to have a cross-shaped section and distributed and disposed so that an installation density decreases from the central portion of the second horizontal collection plate toward the outer peripheral vertical blade plates at the periphery.

In the exemplary embodiment, the spacing plates may be installed on the bottom surface of the second horizontal collection plate and protrude to have a "¬"-shaped cross-section so as to surround inward fastening holes formed at four portions adjacent to vertices, the spacing plates may support the intermediate collection part so that the intermediate collection part is spaced apart from the lower-end collection part, and the spacing plates may be configured to collect the by-products from the exhaust gas discharged through the fastening holes.

In the exemplary embodiment, the lower-end collection part may include: a quadrangular third horizontal collection plate having a plurality of gas holes formed along an outer periphery thereof and configured to collect the by-products while guiding the exhaust gas, which flows downward from the upper portion, to the outer periphery; a plurality of quadrangular collection plates disposed radially on an upper surface of the third horizontal collection plate and having a plurality of gas holes formed in a surface thereof, the plurality of quadrangular collection plates being configured to collect the by-products while maximizing a contact surface with the exhaust gas while allowing the exhaust gas to be uniformly distributed; and quadrangular rim collection plates provided on a bottom surface of the third horizontal collection plate and having a plurality of gas holes in a surface thereof, the quadrangular rim collection plates disposed in a dual structure including outer periphery collection plates and inner collection plates, which are provided in the form of a quadrangular rim, in order to allow the exhaust gas to be uniformly distributed, collect the by-products, and finally minimize a degree to which the by-products are discharged through the discharge port.

In the exemplary embodiment, a storage groove portion may be formed in an upper surface of a lower plate of the housing so as to be lower than an upper end of the gas discharge port around a gas discharge port in order to store the by-products, and a plurality of internal collection tower supports, which each have a lower-end rod and an upper-end rod configured in a stepped manner, may be provided on the lower plate, such that the upper-end collection part, the intermediate collection part, and the lower-end collection part, which constitute the internal collection tower, are vertically spaced apart from one another and configured on multiple stages.

In the exemplary embodiment, the heater may include: a heater cap installed to communicate with a gas inlet port provided in an upper plate of the housing and configured to supply the introduced gas to a lower heater main body; a heater main body configured to heat the exhaust gas, which flows downward from the upper portion, and distribute the exhaust gas in a transverse direction through heat radiating fins disposed radially; and a quadrangular heater plate configured to supply the exhaust gas, which is distributed from the heater main body, to the inner wall of the housing at the outer periphery and allow the exhaust gas to flow downward and having a plurality of gas holes at a periphery thereof to allow the exhaust gas to be supplied to the inner wall of the housing at the outer periphery.

According to the apparatus for collecting by-products according to the present disclosure characterized as described above, the exhaust gas, which is introduced into the housing of the collection apparatus through the inlet port, is guided to the lower heater through the heater cap so as not to be dispersed to the periphery in a state in which the exhaust gas is not aggregated or heated at the introduction point. The heated exhaust gas is distributed to the periphery, flows downward, and generates the collection reaction at multiple stages by the collection structure and the smooth change in exhaust gas flow path while passing through the internal collection tower including the upper-end collection part, the intermediate collection part, and the lower-end collection part. In particular, the by-products are mainly collected and accumulated in the internal space of the intermediate collection part having the open gas flow structures of the inner wall of the housing and the inner region, and the exhaust gas is subjected to the collection reaction again in the lower-end collection part, such that only the exhaust gas from which the by-products are removed is discharged to the lower discharge port. In order to increase the collection area like the by-products collection apparatus having a low capacity in the related art, the exhaust gas is stagnated by the gas hole structure formed on the surface plate and the complicated assembled structure of the internal collection tower having the lattice-shaped structure made by the plurality of quadrangular surface collection plates that intersect one another, such that the local collection reaction occurs. Therefore, it is possible to basically prevent the structural problem in which the by-products adhere to the periphery or are accumulated, and the flow path is narrowed and clogged, which causes rapid collection efficiency and requires the replacing or cleaning process even though the effective collection space is sufficiently present. Further, it is possible to provide the uniform collection reaction by maximally using the effective collection space in the collection apparatus.

In addition, according to the present disclosure, the horizontal collection plates, which have different areas and gas holes different in sizes, shapes, and arrangements for the upper-end collection part, the intermediate collection part, and the lower-end collection part that constitute the internal collection tower, to allow collected by-products to be accumulated while regulating and guiding upward and downward flows of exhaust gas and minimize a degree to which the exhaust gas at the upper side is discharged to the lower discharge port or a degree to which the by-products are accumulated at the lower side and easily flow outward, thereby improving collection space efficiency.

In addition, according to the present disclosure, the lower-end collection part, which constitutes the internal collection tower, is disposed to be maximally adjacent to the lower plate of the housing, the storage groove portion in which the by-products may be accumulated is provided on the lower plate, and the exhaust gas is allowed to flow to the central portion from the outer periphery at the lower side of the lower-end collection part. Therefore, the gas discharge port need not protrude greatly to the inside of the housing to minimize a degree to which the exhaust gas is easily discharged to the gas discharge port. Therefore, the collection spaces of the intermediate collection part and the lower-end collection part are not reduced, which may ensure the sufficient collection space.

Therefore, the present disclosure a useful invention having many effects and is an invention that is highly expected to be used in industry, because it is possible to improving the efficiency of the semiconductor manufacturing process by increasing the usage cycle by collecting a large amount of by-products contained in the exhaust gas over a long period of time by maximally using the limited collection space even in the case of the collection apparatus capable of treating the by-products with a relatively low capacity.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
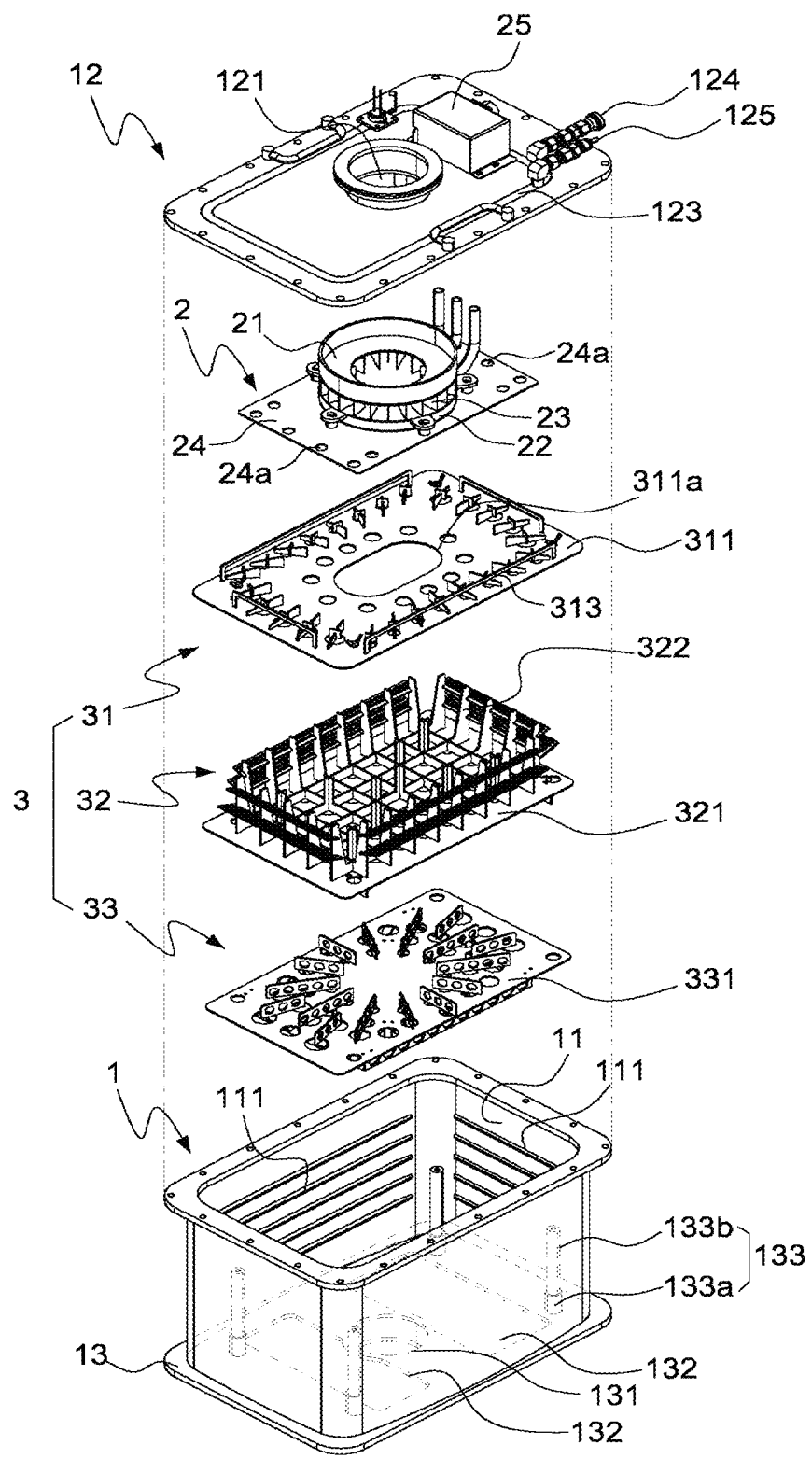
FIG. 1 is an exploded perspective view of an apparatus for collecting by-products according to an embodiment of the present disclosure.
Figure 2:
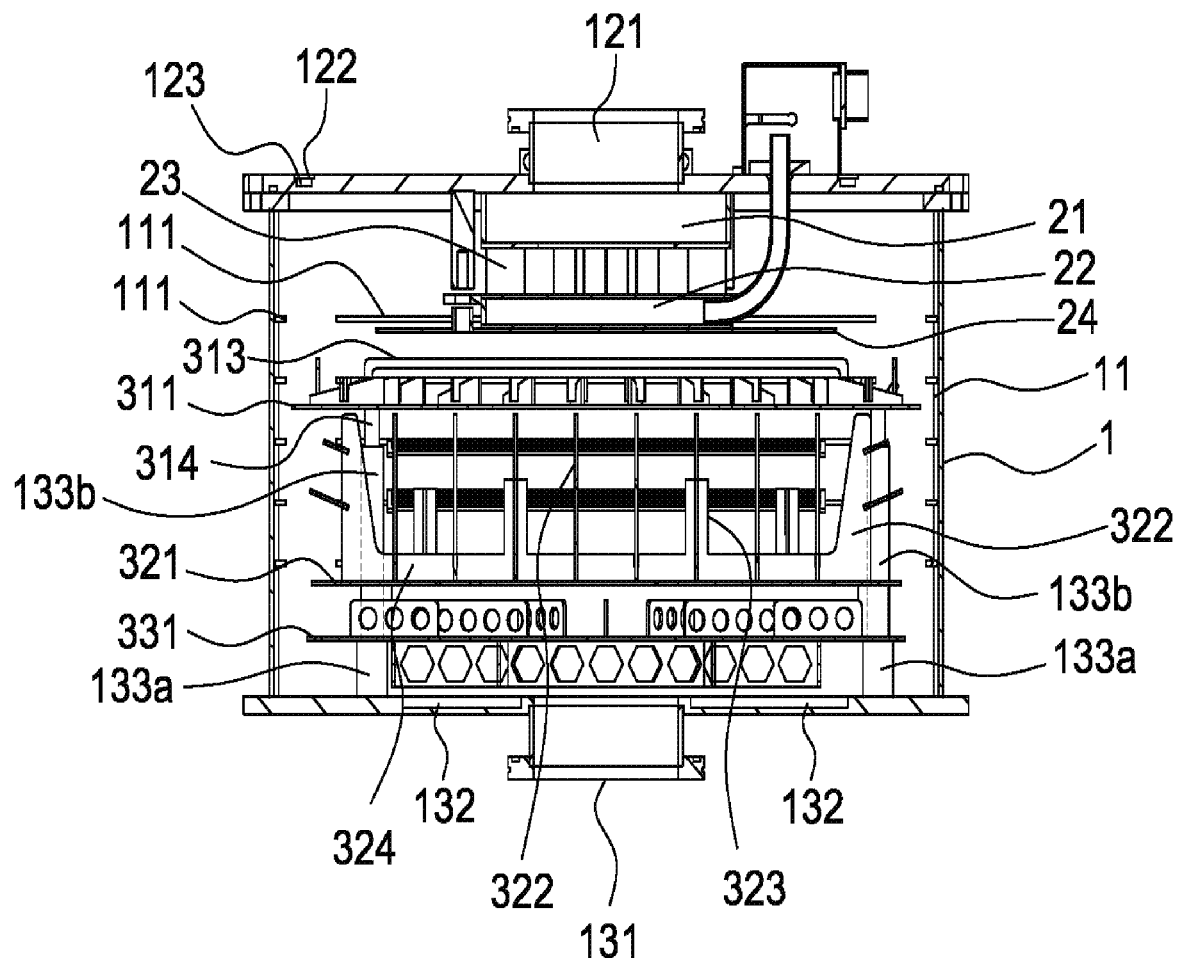
FIG. 2 is an exemplified cross-sectional view of the apparatus for collecting by-products according to the embodiment of the present disclosure.
Figure 3:
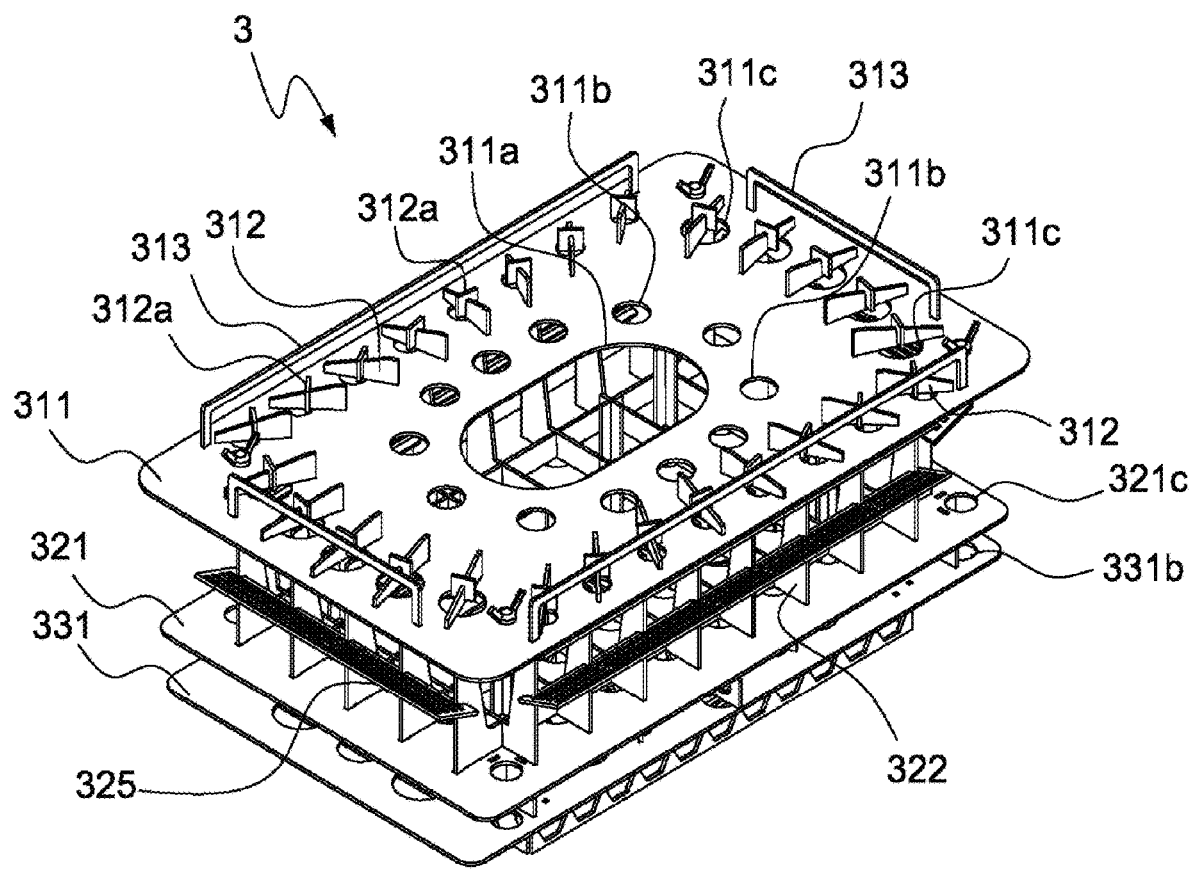
FIG. 3 is a perspective view illustrating an internal collection tower according to the embodiment of the present disclosure.
Figure 4:
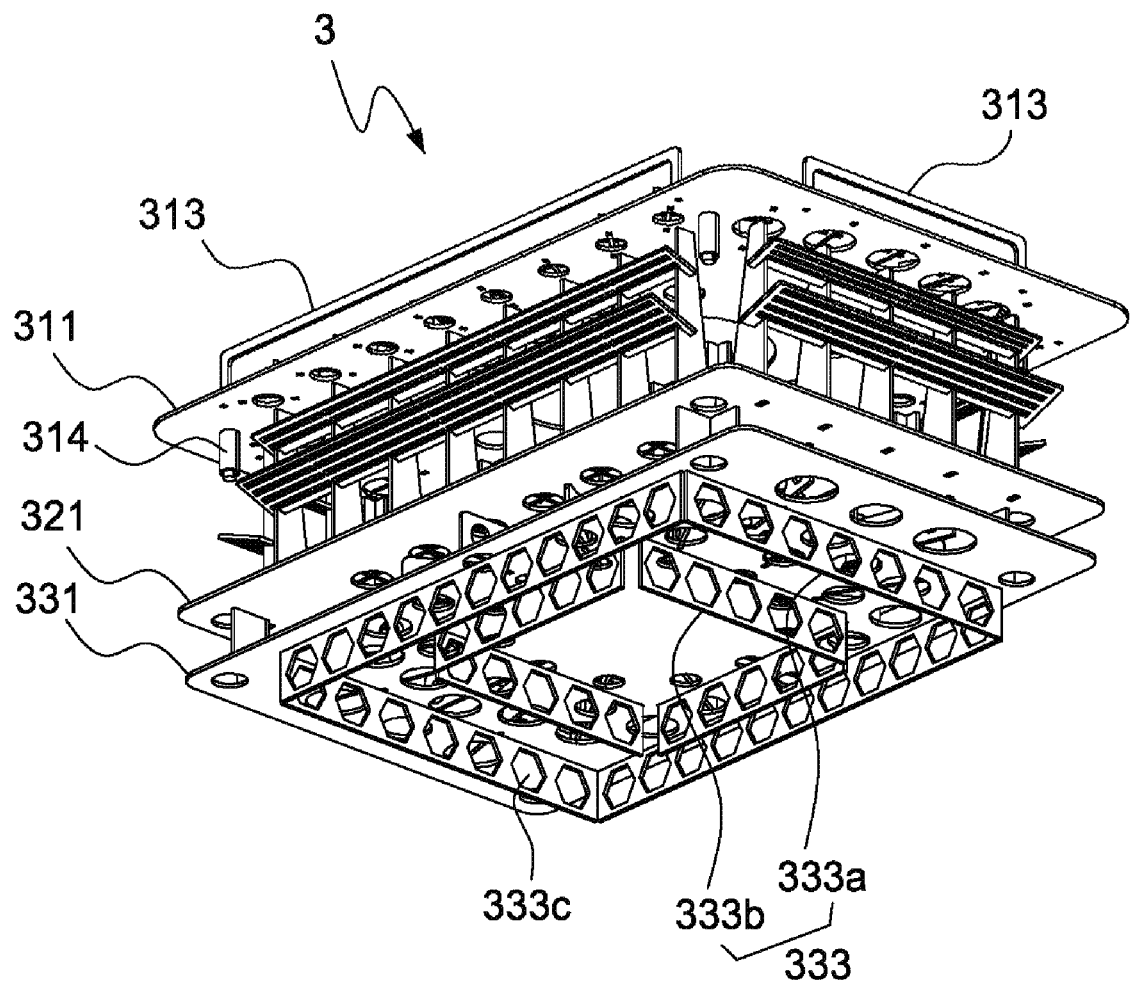
FIG. 4 is a perspective view of a bottom side of the internal collection tower according to the embodiment of the present disclosure.
Figure 5:
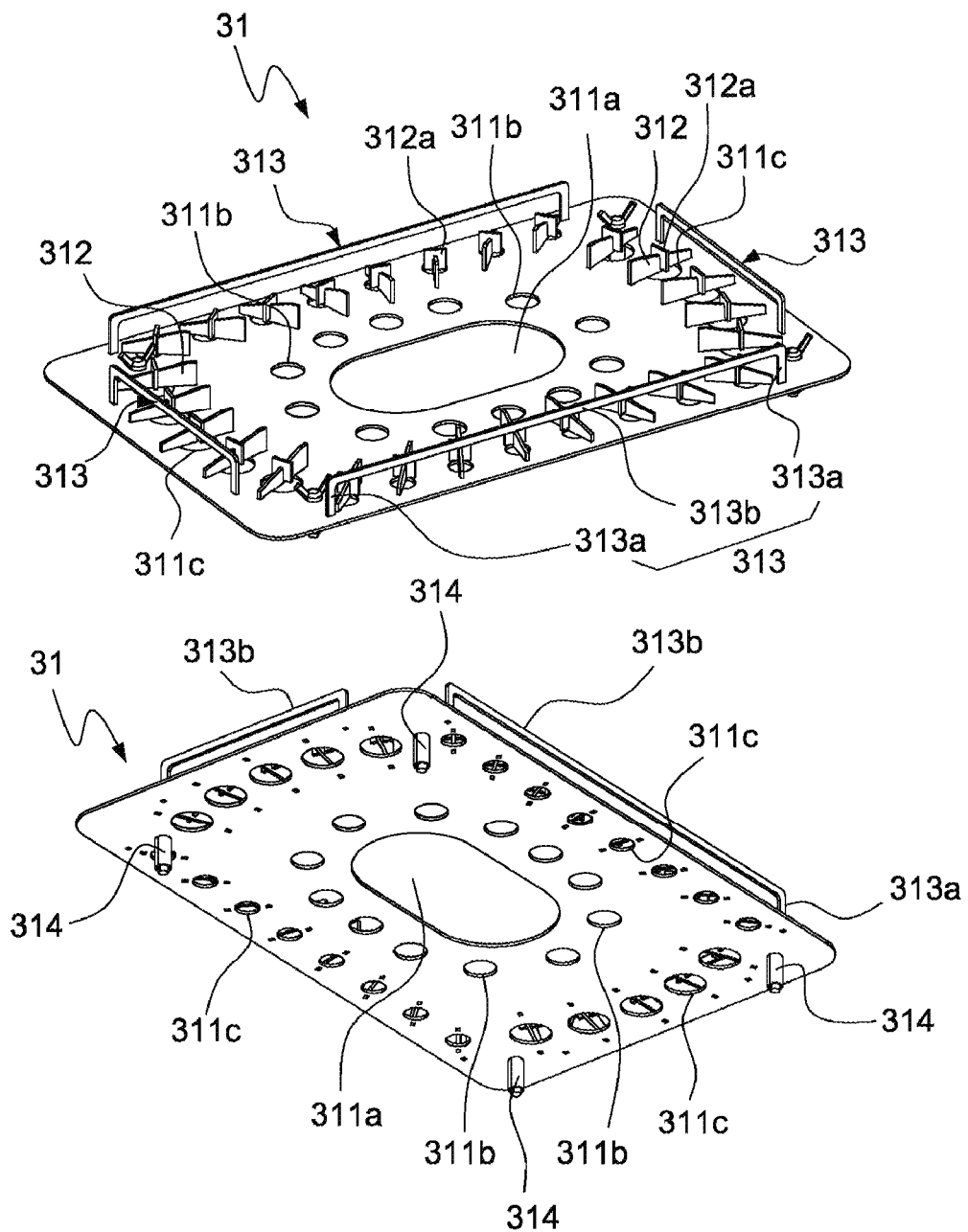
FIG. 5 is an exemplified view illustrating an upper-end collection part of the internal collection tower according to the embodiment of the present disclosure.
Figure 6:
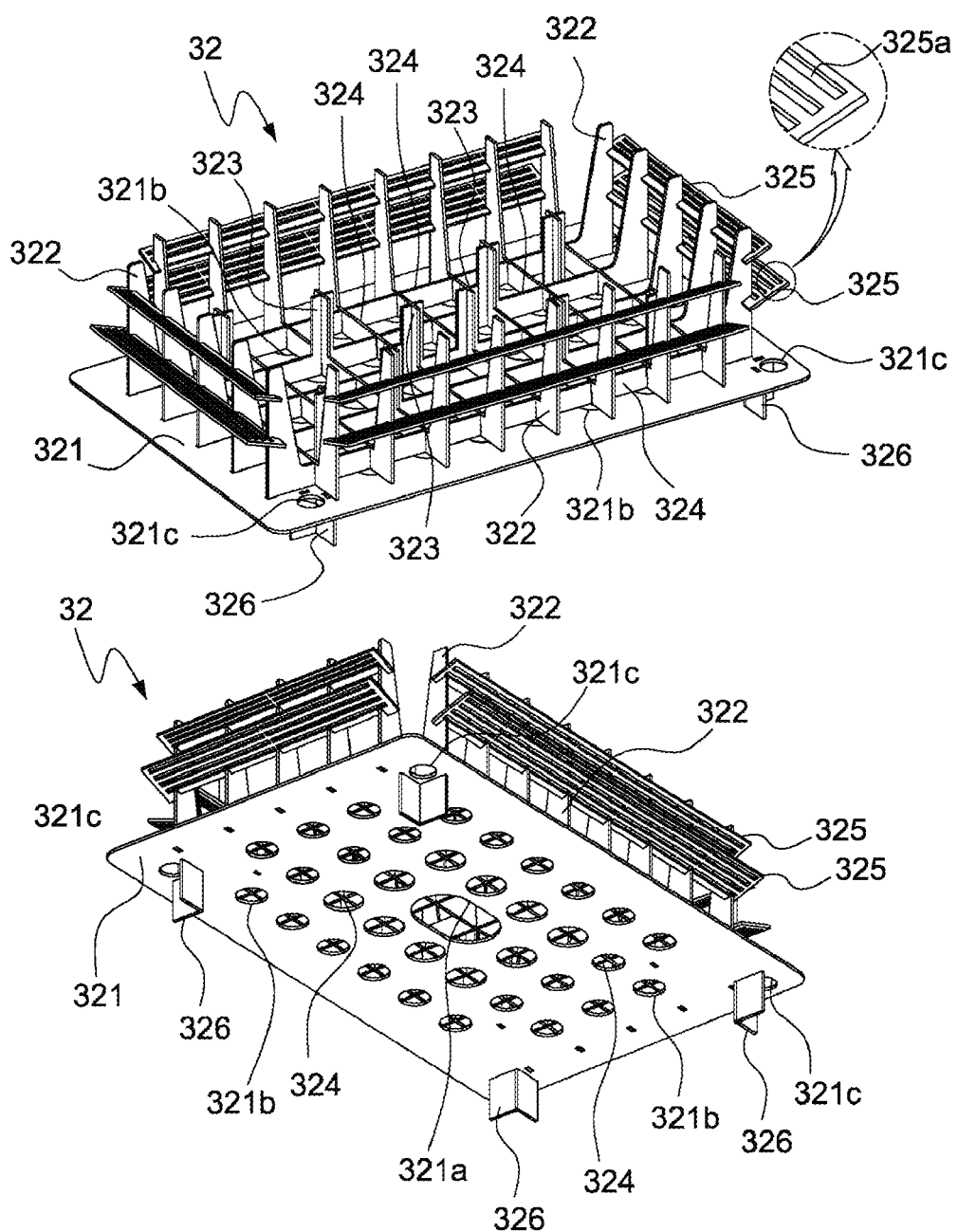
FIG. 6 is an exemplified view illustrating an intermediate collection part of the internal collection tower according to the embodiment of the present disclosure.
Figure 7:
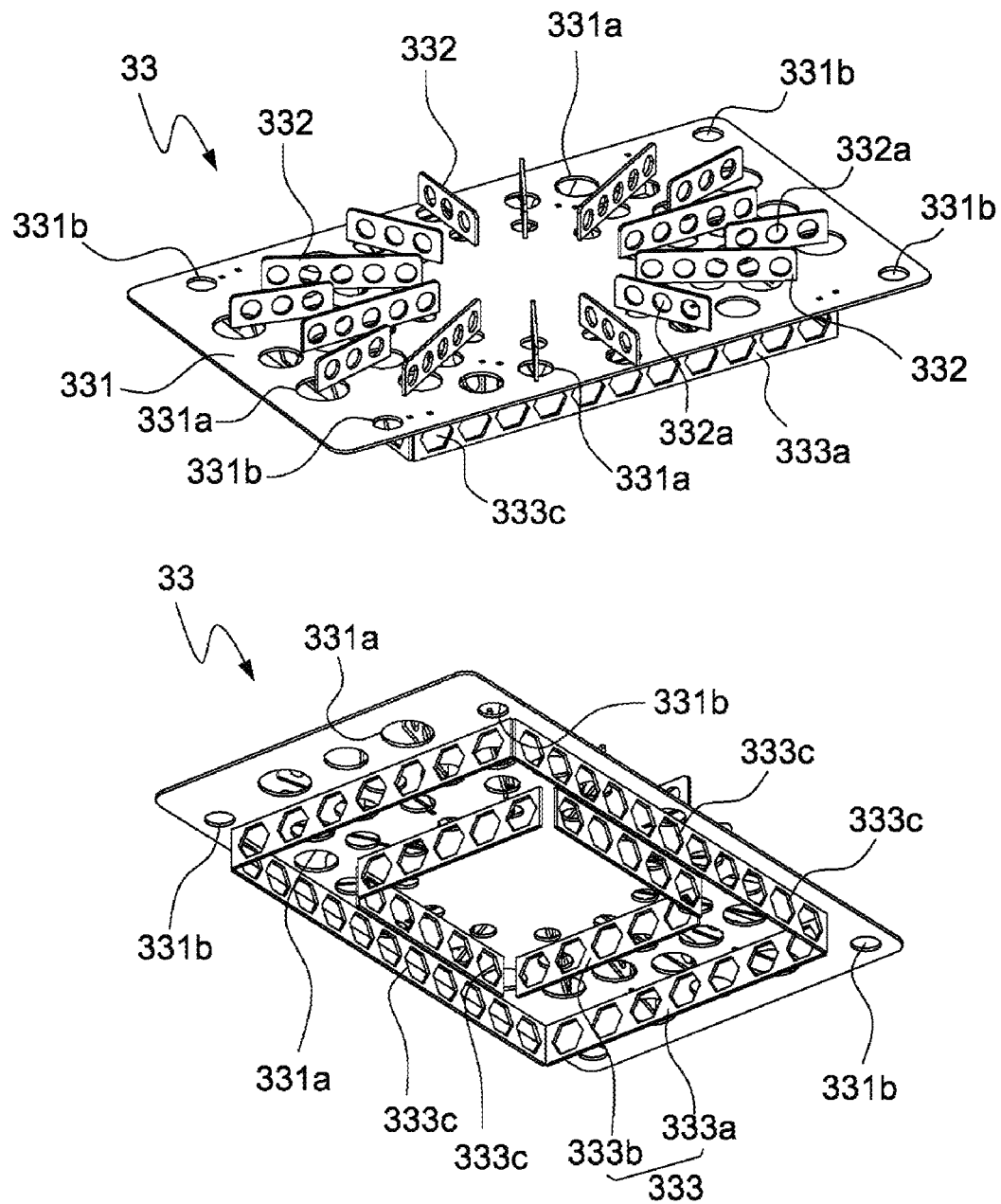
FIG. 7 is an exemplified view illustrating a lower-end collection part of the internal collection tower according to the embodiment of the present disclosure.

FIG. 1 is an exploded perspective view of an apparatus for collecting by-products according to an embodiment of the present disclosure, FIG. 2 is an exemplified cross-sectional view of the apparatus for collecting by-products according to the embodiment of the present disclosure, FIG. 3 is a perspective view illustrating an internal collection tower according to the embodiment of the present disclosure, FIG. 4 is a perspective view of a bottom side of the internal collection tower according to the embodiment of the present disclosure, FIG. 5 is an exemplified view illustrating an upper-end collection part of the internal collection tower according to the embodiment of the present disclosure, FIG. 6 is an exemplified view illustrating an intermediate collection part of the internal collection tower according to the embodiment of the present disclosure, and FIG. 7 is an exemplified view illustrating a lower-end collection part of the internal collection tower according to the embodiment of the present disclosure.

As illustrated, a collection apparatus according to the present disclosure is an apparatus for collecting by-products for a semiconductor manufacturing process, the apparatus being installed in an exhaust line between a process chamber and a vacuum pump and configured to collect by-products in exhaust gas discharged from the processor chamber. The collection apparatus includes a housing 1 configured to accommodate introduced exhaust gas and then discharge the exhaust gas, a heater 2 configured to distribute the introduced exhaust gas to an outer periphery while preventing aggregation of the exhaust gas at an introduction part and providing a collection temperature condition in the housing, and an internal collection tower 3 having a multi-stage structure including an upper-end collection part 31, an intermediate collection part 32, and a lower-end collection part 33 and configured to collect the by-products while changing a flow path direction of the introduced exhaust gas by maximally using a limited space in the housing, the internal collection tower 3 being configured such that the intermediate collection part 32, which includes collection plates each having an open structure to allow the gas to smoothly flow between an inner wall of the housing 1 and an inner region, mainly collects the by-product so that the by-product is accumulated in an internal space of the intermediate collection part 32.

The collection apparatus collects solid reaction products contained in exhaust gas discharged from a process chamber for producing semiconductors under the following mechanism and temperature condition.

$$TiCl_{4(g)} + nNH_{3(g)} \rightarrow NH_4Cl_{(s)} + HCl_{(g)} + TiCl_4 \cdot nNH_3$$

According to a reaction condition under which by-products are collected by the mechanism, the growth decreases in a temperature region in which a temperature of the exhaust gas introduced into the collection apparatus is higher than 120° C. Therefore, the solid by-products are collected under a temperature condition in which a temperature in the housing is 120° C. or lower.

As one embodiment, the collection apparatus is a collection apparatus having a small capacity, i.e., a by-product treatment capacity of about 15 kg. The collection apparatus may be installed and configured between the process chamber and the vacuum pump. However, the present disclosure is not limited by the numerical value of the treatment capacity.

The collection apparatus, which has a small by-product treatment capacity, is typically installed to be embedded in a clean room in which a process chamber for producing semiconductors by using wafers is installed. For this reason, the collection apparatus cannot provide a large by-product treatment capacity and a free replacement or repair environment, unlike a collection apparatus installed at a stage lower than a stage on which a clean room is positioned. Therefore, in order to increase a usage cycle, the present disclosure provides the collection apparatus having the internal collection tower structure capable of maximally using a collection space to be described below.

The collection apparatus according to the present disclosure is manufactured by using a material such as titanium, stainless steel, or aluminum to prevent corrosion or the like caused by the exhaust gas discharged from the process chamber.

The housing 1 has a quadrangular hollow housing shape and serves to store gas so that the exhaust gas, which is introduced into the internal collection tower 3 installed in the housing 1, is aggregated and collected. The housing is opened at an upper side thereof, and the internal collection tower is accommodated and installed in the housing. The upper plate covers the housing and is fixed by using a fastening means such as a bolt.

A plurality of vortex plates 111, which protrudes inward, may be provided on multiple stages along an inner wall 11 of the housing. In case that the vortex plates 111 are provided, the exhaust gas, which is introduced into the housing, generates vortices while colliding with the vortex plates 111, such that a flow of the exhaust gas may stagnate, which improves by-product collection efficiency.

That is, the vortex plates 111 installed on the inner wall of the housing, which is in direct contact with outside air having a temperature relatively lower than an internal temperature of the housing, are cooled by a thermally conducted outside temperature, such that the exhaust gas, which is stagnated by the vortices, is aggregated and collected.

The vortex plate 111 may be shaped so that the vortex plate 111 horizontally protrudes inward, or an end portion of the vortex plate 111 is bent at a predetermined angle in any one of upward and downward directions or protrudes to have a curvature shape, such that a large number of vortices occur.

An upper plate 12, which defines an upper portion of the housing, serves as a cover that covers the open upper side of the housing. The upper plate 12 has a gas inlet port 121 protruding upward so that the exhaust gas is introduced. The upper plate 12 is configured to receive the exhaust gas discharged from the process chamber.

In addition, a heater power supply part 25 is installed on the upper plate and configured to supply power to a heater installed on a bottom surface of the upper plate. The heater power supply part 25 includes a temperature sensor configured to measure a temperature so that the power is controlled depending on the internal temperature.

In addition, a coolant flow path 122 is formed in an upper surface of the upper plate and processed in a groove shape in the upper surface of the upper plate in order to prevent the housing from being heated by an operation of the heater disposed in the housing and installed on the lower portion of the upper plate. An upper portion of the coolant flow path is configured to be blocked by a flow path cover 123. In this case, although not illustrated, the flow path cover may be fastened by sealing for liquid tightness, and well-known fastening methods such as fitting, welding, and bolting may be applied.

The coolant flow path 122 is configured such that the coolant supplied from an external coolant tank (not illustrated) is introduced through the coolant inlet port 124 and then circulated and discharged through the coolant discharge port 125. The adjacent parts of the coolant flow path have a boundary portion without communicating with each other so that the introduced coolant and the coolant to be discharged are not mixed. Water or a refrigerant may be used as the coolant.

A lower plate 13, which defines a lower portion of the housing, has a gas discharge port 131 formed at one point thereon. The gas discharge port 131 is used as a passageway through which the exhaust gas, from which the by-products have been removed, is discharged.

In this case, one or more storage groove portions 132 are formed in an upper surface of the lower plate and disposed around the gas discharge port 131 so as to be lower than an upper end of the gas discharge port so that the by-products, which are collected and dropped, may be accumulated. Because the storage groove portions 132 are formed as described above, a degree to which the exhaust gas easily flows outward is minimized when the exhaust gas finally flows from the inner wall of the housing to the gas discharge port of the central portion at a lower side of the lower-end collection part of the internal collection tower.

Therefore, the gas discharge port need not greatly protrude toward an inner upper portion of the housing, such that collection spaces of the intermediate collection part and the lower-end collection part are not reduced, which may sufficiently ensure the collection space.

In addition, internal collection tower supports 133 protrude upward from portions disposed adjacent to vertices of the upper surface of the lower plate 13.

At least four internal collection tower supports 133 each have a two-stage structure including a lower-end rod 133$a$ and an upper-end rod 133$b$. The lower-end rod 133$a$ has a larger diameter than the upper-end rod 133$b$, such that a stepped portion is formed.

The lower-end rod 133$a$ has a predetermined height by which the lower-end collection part of the internal collection tower is spaced apart from the upper surface of the lower plate. The upper-end rods 133$b$ penetrate fastening holes of a third horizontal collection plate 331 of the lower-end collection part 33 and fastening holes of a second horizontal collection plate 321 of the intermediate collection part 32 and are fastened to fastening rods 314 protruding downward from a first horizontal collection plate 311 of the upper-end collection part 31. The fastening holes are formed at the portions disposed adjacent to the four vertices.

In this case, the intermediate collection part 32 is spaced apart from, at a predetermined interval, the upper portion of the lower-end collection part by spacing plates 326 protruding downward from the second horizontal collection plate 321 while adjoining the upper portion of the lower-end collection part.

With the fastening structure with the internal collection tower support 133, the upper-end collection part, the intermediate collection part, and the lower-end collection part of the internal collection tower have the structures spaced apart from one another at a predetermined interval, thereby providing spaces in which the exhaust gas may flow along multiple stages.

The heater 2 may heat the exhaust gas, which is introduced into the housing, so that a temperature distribution region with a temperature higher than 120° C. is defined so that the exhaust gas is not aggregated in a lower region of the gas inlet port, and the gas inlet port is not blocked. The heater 2 distributes the exhaust gas to the outer periphery so that the exhaust gas flows downward toward the inner wall of the housing and the internal collection tower to define a temperature distribution region with a temperature lowered to 120° C. or less. Therefore, a collection reaction of the solid by-product contained in the exhaust gas may occur on the inner wall of the housing and the internal collection tower.

To this end, a heater cap 21 is installed to adjoin a bottom surface of the upper plate and communicates with a lower portion of the gas inlet port 121 formed in the upper plate of the housing, such that the introduced exhaust gas is collected in the housing and flows downward without being dispersed to the periphery of the housing. The heater cap 21 has a cylindrical shape structure. The heater cap 21 has a doughnut shape so that an upper portion of the heater cap 21 has an opening, and a lower portion of the heater cap 21 has an opening smaller than the upper opening, such that the exhaust gas introduced from the upper side is accommodated in the heater cap 21 and then discharged to a lower heater main body through the central portion.

A heater main body 22 is provided at the lower side of the heater cap 21 and has heat radiating fins 23 disposed radially. Therefore, the exhaust gas flowing downward from the upper side is heated and then distributed laterally in the housing 1 through the heat radiating fins disposed radially.

In addition, a heater plate 24 having a quadrangular shape is fastened to a lower portion of the heater main body 22, such that the exhaust gas radially distributed to the outer periphery by the heat radiating fins of the upper heater main body is prevented from flowing directly downward at the initial time, and thus the exhaust gas is guided to flow toward the inner wall of the housing 1 at the outer periphery, such that the exhaust gas flows downward in the vicinity of the inner wall of the housing at the outer periphery.

To this end, a size or area of the heater plate 24 is smaller than an inner planar space of the housing.

In addition, a plurality of gas holes 24a is formed at two opposite short sides before the end portion, such that a part of the exhaust gas flows downward at sides of triangular collection plates 312 so that the exhaust gas flowing through the heater plate 24 does not concentratedly flow downward only at the end portion.

When power is applied to a heat source of the heater main body by the heater power supply part 25 installed on the upper surface of the upper plate, the heat source generates heat with a temperature, e.g., a temperature higher than 120° C. A material such as ceramic or Inconel is used as a material of the heater in order to prevent corrosion caused by the exhaust gas.

The internal collection tower 3 is accommodated and installed in the housing and configured to aggregate the exhaust gas and collect the by-products while lengthening the residence time and the flow path of the introduced exhaust gas. The internal collection tower 3 has the structure in which a collection region is divided vertically into the upper-end collection part 31, the intermediate collection part 32, and the lower-end collection part 33 on the basis of heights in order to collect the gas, which is introduced into the housing, in a multi-stage collection manner. The main by-products are accumulated in the internal space of the intermediate collection part having the open gas flow structure between the inner wall of the housing and the inner region, such that the efficiency of the collection space is improved.

In addition, the internal collection tower includes the quadrangular horizontal collection plates having different areas and gas holes different in sizes, shapes, and arrangements for the upper-end collection part, the intermediate collection part, and the lower-end collection part. The internal collection tower, together with the heater plate 24 of the heater, directly collects the by-products or allows the collected by-products to be accumulated while regulating and guiding the directions of the upward and downward flows of the exhaust gas, thereby minimizing a degree to which the exhaust gas at the upper side is discharged directly to the lower discharge port or a degree to which the collected by-product is dropped downward and easily flows outward through the discharge port.

In particular, the first horizontal collection plate of upper-end collection part installed to be spaced apart downward from the heater plate 24 of the heater at a predetermined interval is large in size than the heater plate 24 of the heater, such that the main flow of the exhaust gas is collected in the central portion so that the exhaust gas forward downward. The second horizontal collection plate and the third horizontal collection plate are formed such that the intermediate collection part and the lower-end collection part are larger in size than the heater plate 24 and slightly smaller in size than the first horizontal collection plate of the upper-end collection part. The second horizontal collection plate of the intermediate collection part induces a downward flow of the uniformly dispersed exhaust gas through a center gas hole and the plurality of uniformly arranged gas holes, such that the exhaust gas is sufficiently collected on an inner portion of the intermediate collection part. The third horizontal collection plate of the lower-end collection part induces a downward flow of the gas through the end portion and the peripherally arranged gas holes while guiding the exhaust gas, which uniformly flows downward, to the outer periphery, thereby providing the opportunity to maximally collect the remaining by-product.

In addition, the upper-end collection part 31, the intermediate collection part 32, and the lower-end collection part 33, which constitute the internal collection tower 3, protrude from the lower plate of the housing to ensure an interval between the upper and lower end portions and are supported and fastened by the internal collection tower supports 133 including the lower-end rod 133a and the upper-end rod 133b with a stopped portion therebetween.

Specifically, the lower-end rod 133a of the internal collection tower support 133 is supported on the lower-end collection part 33 of the internal collection tower and installed to be spaced apart from the upper surface of the lower plate at a predetermined height.

In addition, the intermediate collection part 32 is spaced apart from the upper surface of the third horizontal collection plate of the lower-end collection part 33 at a predetermined interval while adjoining the upper surface of the third horizontal collection plate of the lower-end collection part 33 by the spacing plate 326 protruding downward from the quadrangular second horizontal collection plate.

In addition, the fastening rod 314 of the upper-end collection part 31, which protrudes downward from the first horizontal collection plate, is screw-coupled and fastened to the upper-end rod 133b of the internal collection tower support 133 that penetrates the lower-end collection part 33 and the intermediate collection part 32.

With the fastening structure with the internal collection tower support 133, the upper-end collection part, the intermediate collection part, and the lower-end collection part of the internal collection tower have the structures spaced apart from one another at a predetermined interval, thereby providing spaces in which the exhaust gas may flow along multiple stages.

The upper-end collection part 31 includes: the quadrangular first horizontal collection plate 311 having a main gas hole 311a and a plurality of auxiliary gas holes 311b and 311c formed around the main gas hole 311a and configured to collect the by-products while guiding the flow of the exhaust gas, which flows downward from the heater, to the central portion; the plurality of triangular collection plates 312 arranged radially along an outer periphery of an upper surface of the first horizontal collection plate and configured to collect the by-products; bent-type collection plates 313 provided at four edges of the upper surface of the first horizontal collection plate and protruding to be higher than the triangular collection plates, the bent-type collection plates 313 being configured to collect the by-products while having an open structure so as not to hinder the introduction flow of the exhaust gas; and the fastening rods 314 protruding downward and corresponding to the vertices of the bottom surface of the first horizontal collection plate, the fastening rods 314 being fastened and fixed to the internal collection tower supports 133.

The main gas hole 311a is provided in the form of a long hole formed at the center of the first horizontal collection plate 311. The main gas hole 311a is configured such that the majority of the exhaust gas, which is allowed to flow through the inner peripheral portion in the housing by the heater, flows downward, and collides with the surface of the first horizontal collection plate 311 installed to be adjacent to the inner wall of the housing, does not flow downward directly toward the lower side. Further, the main gas hole 311a is configured such that the main flow of the exhaust gas flows from the outer periphery toward the central portion and flows downward toward the central portion of the lower intermediate collection part.

In addition, in the first horizontal collection plate 311, the plurality of auxiliary gas holes 311b arranged around the main gas hole and the plurality of auxiliary gas holes 311c arranged along the outer periphery serve to reduce, in advance, the amount and intensity of the exhaust gas, which is introduced into the main gas hole 311a and flows downward, and move the exhaust gas downward toward the intermediate collection part and supply the exhaust gas.

In this case, in one embodiment, the auxiliary gas hole 311c, which is positioned at a short side among the plurality of auxiliary gas holes 311c arranged along the outer periphery, is formed as an opening having a relatively larger diameter than each of the plurality of auxiliary gas holes 311b arranged around the main gas hole. The auxiliary gas hole 311c positioned at a long side is formed as an opening having a relatively smaller diameter than each of the plurality of auxiliary gas holes 311b. Therefore, the overall discharge downward flow of the exhaust gas may be uniformly distributed along the area of the first horizontal collection plate 311 having a rectangular shape.

In addition, the flow of the exhaust gas flowing downward from the auxiliary gas holes 311b and 311c serves as a kind of air curtain when the exhaust gas, which is supplied from the main gas hole 311a of the intermediate collection part positioned below the upper-end collection part, flow to the outer periphery direction. Therefore, the exhaust gases generate vortices while colliding with one another in different airflow directions, which stagnates the exhaust gas and allows the exhaust gas to stay in the inner region of the intermediate collection part, which makes it possible to increase the collection time. Further, it is possible to allow the exhaust gas to stay in the intermediate collection part by preventing the by-products accumulated in the internal space from being discharged through the outer periphery.

The triangular collection plate 312 has a right-angled triangular shape having a vertical surface positioned adjacent to the central portion. A small amount of load is applied to the flow of the exhaust gas flowing inward from the periphery. The contact area increases toward to the inner center, such that the amount of collection increases, and the flow of the exhaust gas is uniformly guided.

In this case, at the time of arranging the triangular collection plates 312 radially, the plurality of auxiliary holes 311c arranged along the outer periphery on the surface of the first horizontal collection plate is positioned at the upper side, and vertical plate pieces 312a are fastened to intersect one another at auxiliary hole points and each have a relatively small area. Therefore, the exhaust gas is stagnated by vortices occurring when a part of the exhaust gas flowing toward the center collides with the vertical plate pieces 312a, such that the by-products may be collected, and a part of the exhaust gas may flow downward.

The bent-type collection plate 313 is configured to collect the by-products contained in the exhaust gas at the upper side, which is introduced into the space portion between the lower portion of the heater plate 24 and the upper-end collection part 31 in order to maximally use the limited internal space of the collection apparatus according to the present disclosure that has a low collection capacity.

To this end, the bent-type collection plate has a "  " shape defined by a pair of support bodies 313a formed on the outer periphery of the first horizontal collection plate and a connection body 313b configured to connect upper ends of the support bodies. The bent-type collection plate provides a smooth flow of the exhaust gas by means of the open structure and collects the by-products contained in the exhaust gas passing through the upper portion without being collected by the triangular collection plates 312 disposed at the lower positions, thereby increasing the collection space by using the limited space. In this case, the bent-type collection plate 313 may be configured as a single molded body made by integrating the support bodies 313a and the connection body 313b configured to connect the upper ends of the support body. Alternatively, the support bodies 313a and the connection body 313b, which are separated from one another, may be integrated by being welded or fastened.

The fastening rod 314 may be configured as a hollow cylindrical tube, and a bolt may be inserted into the fastening rod 314. The fastening rod 314 is fixed by being fastened to a screw thread formed on the upper-end rod 133b of the internal collection tower support 133 that comes into surface contact with a lower end of the fastening rod 314.

The intermediate collection part 32 includes: the quadrangular second horizontal collection plate 321 having a main gas hole 321a formed in a central portion of a surface thereof, and a plurality of auxiliary gas holes 321b uniformly formed and quadrangularly arranged on the entire remaining surface thereof, the second horizontal collection plate 321 configured to collect the by-products while guiding the flow of the exhaust gas; a plurality of outer peripheral vertical blade plates 322 arranged along an outer peripheral edge of the upper surface of the second horizontal collection plate and configured to collect the by-products with an installation structure opened so as not to block the flow of the exhaust gas between the inner wall of the housing and the inner region; a plurality of inner vertical blade plates 323 protruding in the inner region of the upper surface of the second horizontal collection plate so as to be disposed at a height lower than the outer peripheral vertical blade plates 322, the plurality of inner vertical blade plates 323 being configured to collect the by-products; bottom plates 324 protruding in a lattice shape in the inner region of the upper surface of the second horizontal collection plate so as to be disposed at a height lower than the inner vertical blade plates 323, the bottom plates 324 being configured to collect the by-products; inclined plates 325 configured to intersect the outer peripheral vertical blade plates 322 in the horizontal direction and installed on multiple vertical stages, the inclined plates 325 being configured to collect the by-products while generating vortices; and the spacing plates 326 protruding downward from the bottom surface of the second horizontal collection plate 321 and supported on the lower-end collection part, the spacing plates 326 being configured to collect the by-products while spacing the second horizontal collection plate 321 and the lower-end collection part at a predetermined interval. The outer peripheral vertical blade plates 322, which define the periphery, each have the open structure between the inner wall of the housing and the inner region and collect the by-products while improving the spatial utilization by means of a height difference between the inner vertical blade plates 323, such that the by-products are accumulated in the inner region, thereby maximizing the utilization of the collection space.

The main gas hole 321*a* formed in the second horizontal collection plate 321 is provided in the form of a long hole at the center of the second horizontal collection plate 321 so as to be relatively much smaller than the main gas hole 311*a* formed in the first horizontal collection plate 311. As described above, the main gas hole 311*a* is formed to be relatively smaller than the main gas hole of the upper-end collection part, such that the main flow of the exhaust gas introduced from the upper portion does not flow downward immediately, but only a part of the main flow of the exhaust gas directly flows downward. The remaining part of the main flow of the exhaust gas is dispersed by colliding with the surface of the second horizontal collection plate 321 and flows in a transverse direction.

In addition, the plurality of auxiliary gas holes 321*b*, which is quadrangularly arranged on the entire remaining surface except for the main gas hole 321*a*, is configured such that the exhaust gas, which is introduced through the main gas hole 311*a* formed in the first horizontal collection plate 311 of the upper-end collection part, collides with the surface, and then flows in the transverse direction, and the exhaust gas, which flows downward from the plurality of auxiliary gas holes 311*b* formed in the first horizontal collection plate 311 of the upper-end collection part and the plurality of auxiliary gas holes 311*c* arranged along the outer periphery, uniformly flows downward toward the lower-end collection part at the lower side while being subjected to the collection process in the internal space of the intermediate collection part.

Meanwhile, an overall opening area of the main gas hole 321*a*, which is formed in the second horizontal collection plate 321, and the plurality of auxiliary gas holes 321*b*, which is arranged quadrangularly, is much smaller than an overall surface area of the second horizontal collection plate 321.

Therefore, the exhaust gas, which is introduced from the upper-end collection part at the upper side, is not immediately discharged to the lower-end collection part at the lower side, but the exhaust gas stays in the inner region of the intermediate collection part and is subjected to the process of collecting the by-products by the outer peripheral vertical blade plates 322, the inner vertical blade plates 323, the bottom plates 324, and the inclined plates 325, and then the exhaust gas flows downward toward the lower-end collection part at the lower side.

Meanwhile, fastening holes 321C are formed at four points adjacent to vertices of the second horizontal collection plate 321, such that the upper-end rods 133*b* of the internal collection tower supports 133 penetrate the fastening holes 321C and are fastened to and supported on the fastening rods 314 protruding downward from the upper-end collection part.

The outer peripheral vertical blade plate 322 defines the outer periphery having the open structure between the inner wall of the housing and the inner region of the intermediate collection part. The installation structure is disposed so that a surface thereof is positioned in the transverse direction without being disposed to be directed toward the central portion so that the outer peripheral vertical blade plate 322 does not apply a load to and block or collide with the flow of the exhaust gas introduced from the upper-end collection part to the intermediate collection part. The above-mentioned configuration serves to expand the collection region in the entire housing, like the structure in which the outermost periphery serves as the inner wall of the housing, and the collection plate protrudes toward the inside of the housing. Further, the above-mentioned configuration also provides an effect of guiding a part of the flow of the exhaust gas, which flows downward along the inner wall of the housing through the heater and the upper-end collection part, to the inner region of the intermediate collection part.

The outer peripheral vertical blade plate 322 has a wide lower portion and a narrow upper portion, and an outer portion directed toward the inner wall of the housing has a shape of a vertical right-angled triangular structure, such that the amount of the by-products, which are contained in the exhaust gas introduced from the upper portion and collected, increases toward the lower side and the inside.

In addition, because the outer peripheral vertical blade plates 322 are disposed along the outer periphery, the exhaust gas, which flows downward to the central portion through the main gas hole of the upper-end collection part, comes into contact with the outer peripheral vertical blade plates 322 first, and the by-products are not collected, such that the portion adjacent to the main gas hole is basically prevented from being blocked first.

In addition, because the open regions are installed to be sufficiently spaced apart from one another, the flow of the exhaust gas along the inner wall of the housing is sufficiently maintained even though the open regions between the adjacent outer peripheral vertical blade plates 322 are narrowed as the by-products are collected by the outer peripheral vertical blade plates 322, such that the situation in which the exhaust gas flowing downward from the upper portion is s introduced inward may be sufficiently maintained during the usage cycle.

The inner vertical blade plates 323 are configured to collect the by-products while coming into contact with the exhaust gas flowing downward to the central portion through the main gas hole of the upper-end collection part first, and the inner vertical blade plates 323 each has a lower height than each of the outer peripheral vertical blade plates 322, such that the portion adjacent to the main gas hole is basically prevented from being blocked first.

The inner vertical blade plate 323 has a vertically rectangular structure and is configured to uniformly collect the by-products. The inner vertical blade plate 323 is configured to have a cross-shaped section while intersecting the inner vertical blade plate 323 in the other direction, such that the inner vertical blade plate 323 comes into contact with the exhaust gas dispersed or flowing in various directions and generates vortices, thereby uniformly collecting the by-products.

In addition, the arrangement structure of the inner vertical blade plates 323 is one embodiment. The inner vertical blade plates 323 may be distributed and disposed so that the installation density decreases from the central portion of the second horizontal collection plate 321 toward the outer peripheral vertical blade plates 322 at the periphery. The above-mentioned configuration provides the structure capable of allowing the inner vertical blade plates 323 installed on the central portion to collect the by-products contained in the exhaust gas allowed to flow downward by the main gas hole and allowing the outer peripheral vertical blade plates 322 at the outer periphery to perform the main collection reaction.

The bottom plates 324 are disposed from the outer peripheral vertical blade plates 322 at equal intervals. The long side and short side bottom plates 324 intersect one another to define the lattice shape. The bottom plates 324 define a plurality of groove structures together with the second horizontal collection plates 321 at the lower side and serve to accommodate the exhaust gas flowing downward from the upper side, generate the collection reaction, and accumulate the by-products. The bottom plates 324 prevent the collected by-products from freely floating and moving, thereby minimizing a degree to which the by-products flow to the lower-end collection part and flow outward through the discharge port.

In addition, because a protruding height of the bottom plate 324 is relatively much lower than a height of the inner vertical blade plate 323, the bottom plate 324 does not hinder the flow of the exhaust gas in the inner region or hinder the collection reaction of the inner vertical blade plate 323 and the outer peripheral vertical blade plate 322.

The inclined plates 325 intersect the outer peripheral vertical blade plates 322 in the horizontal direction and are installed on the multiple stages, such that the inclined plates 325 generate vortices by colliding with the exhaust gas flowing downward along the inner wall of the housing and stagnate the by-products, thereby increasing the by-product collection time. Further, the structure inclined upward toward the outer periphery serves to guide the by-product and the exhaust gas to the inner region.

Likewise, the inclined plates 325 also serve to prevent the exhaust gas, which remains in the inner region, from being discharged to the inner wall of the housing at the outer periphery.

In this case, the inclined plates 325 has a plurality of holes 325*a* formed in the longitudinal direction and allow a part of the exhaust gas to flow downward while generating vortices by means of differences in velocities without applying a high load to the flow of the exhaust gas that flows downward.

In addition, the inclined plates 325, which are installed on the multiple stages, are configured such that the lower-end inclined plate 325 further protrudes to the outer periphery and serves to allow the by-products, which are dropped downward, to be accumulated on the lower-end inclined plate 325 without being further dropped in a state in which a lower end of the lower-end inclined plate 325 does not interfere with the upper-end inclined plates 325.

The spacing plates 326 are installed on the bottom surface of the second horizontal collection plate 321 and protrude to have a "¬"-shaped cross-section so as to surround inward the fastening holes 321C formed at the four portions adjacent to the vertices. The spacing plates 326 are in contact with the lower-end collection part and support the intermediate collection part so that the intermediate collection part is spaced apart upward from the lower-end collection part at a predetermined interval. The spacing plates 326 are configured to collect the by-products from the exhaust gas partially discharged through the fastening holes 321C at the initial time.

When the intermediate collection part is provided, the intermediate collection part accommodates the exhaust gas introduced into the central portion from the upper-end collection part 31, such that the main flow of the exhaust gas flows to the lower-end collection part through the main gas hole 321*a* of the central portion of the second horizontal collection plate 321. At the same time, the plurality of auxiliary gas holes 321*b* is quadrangularly arranged on the entire remaining surface of the second horizontal collection plate 321, such that the exhaust gas uniformly flows to the lower-end collection part, and an entirely uniform downward flow of the exhaust gas is formed. In addition, a part of the exhaust gas flows to the outer periphery through the space between the outer peripheral vertical blade plates 322, such that the flow of the exhaust gas flowing downward along the inner wall of the housing is implemented.

Therefore, the by-products contained in the exhaust gas introduced into the internal space are collected by the inner vertical blade plates 323, the outer peripheral vertical blade plates 322, and the bottom plates 324, and the collected by-products are accumulated in the internal space region, such that the collection space of the collection apparatus may be maximally used.

In one embodiment, the outer peripheral vertical blade plates, the inner vertical blade plates, and the bottom plates may be configured by an intersection assembling structure between a plurality of unit long side plates and a plurality of unit short side plates in which pair of outer peripheral vertical blade plates and a pair of inner vertical blade plate and bottom plates are integrated, and an intersection assembling structure between a plurality of unit long side plates and a plurality of unit short side plates in which a pair of outer peripheral vertical blade plates and the bottom plates are integrated.

To this end, the vertical blade plates are respectively provided at two opposite ends of the bottom plates, which define the lower side, and the unit long side plates and the unit short side plates, in which the inner vertical blade plates smaller in size than the vertical blade plates, are integrated, are respectively provided one point and the other symmetric point inside the bottom plates. In this case, the pair of inner vertical blade plates, which is provided symmetrically, is provided at different from the positions of the unit long side plate and the unit short side plate.

Likewise, the unit long side plate and the unit short side plate, in which the vertical blade plates are integrated, are respectively provided at the two opposite ends of the bottom plate that defines the lower side.

Thereafter, the plurality of unit short side plates is installed along the long side of the second horizontal collection plate 331, and the plurality of unit long side plates is installed along the short side so as to intersect the plurality of unit short side plates. In this case, the unit long side plate and the unit short side plate, which have no inner vertical blade plate, are provided at two opposite ends each of the long and short sides. The plurality of unit long side plates and the plurality of unit short side plates, which have the inner vertical blade plate, are positioned at predetermined intervals between the unit long side plate and the unit short side plate.

In this case, the pair of inner vertical blade plates, which is provided symmetrically, is arranged to be positioned to be close to the central portion toward the unit long side plate and the unit short side plate positioned inward.

When the assembling process is ended, the outer peripheral vertical blade plates are positioned along the outer periphery, and the inner vertical blade plates, which intersect one another to define a cross-shaped section, are positioned inward. In addition, the bottom plates intersect one another and define a lattice shape.

In addition, when the inner vertical blade plates each having a cross-shaped section are installed one by one on the surface of the second horizontal collection plate 331 on which the lattice structures are positioned adjacent to the vertices and the bottom plates intersect one another to define the lattice shape, such that the intermediate collection part is provided.

The intermediate collection part shape may be provided in different ways.

The lower-end collection part 33 includes: the quadrangular third horizontal collection plate 331 having a plurality of gas holes 331a formed along an outer periphery thereof and configured to collect the by-products while guiding the exhaust gas, which flows downward from the upper portion, to the outer periphery; a plurality of quadrangular collection plates 332 disposed radially on the upper surface of the third horizontal collection plate and having a plurality of gas holes 332a formed in a surface thereof, the plurality of quadrangular collection plates 332 being configured to collect the by-products while maximizing the contact surface with the exhaust gas while allowing the exhaust gas to be uniformly distributed; and quadrangular rim collection plates 333 provided on the bottom surface of the third horizontal collection plate and having a plurality of gas holes 333c in a surface thereof, the quadrangular rim collection plates 333 disposed in a dual structure including outer periphery collection plates 333a and inner collection plates 333b, which are provided in the form of a quadrangular rim, in order to allow the exhaust gas to be uniformly distributed, collect the by-products, and finally minimize a degree to which the by-products d through the discharge port.

In the third horizontal collection plate 331, the plurality of gas holes 331a is arranged only in the peripheral portion of the surface thereof, such that the exhaust gas, which flows downward through the main gas hole and the auxiliary gas holes of the intermediate collection part, is guided radially by the quadrangular collection plates 332 and the third horizontal collection plate 331 and flows downward through the gas holes of the peripheral portion and the end portion.

The quadrangular collection plates 332 are arranged radially and have the plurality of gas holes, such that the exhaust gas is radially guided and uniformly distributed, and the by-products remaining in the exhaust gas are uniformly collected.

The quadrangular rim collection plates 333 are disposed in the dual structure including the outer periphery collection plates 333a and the inner collection plates 333b that are spaced apart from one another at predetermined intervals and have different sizes. The lower ends of the quadrangular rim collection plates 333 are installed to be adjacent to the lower plate of the housing, such that the exhaust gas flows only through the gas holes 333c, which minimizes the outflow of the by-products through the gas discharge port even though the by-products are dropped and accumulated because of a height from the lower plate to the gas holes 333c.

Further, the storage groove portions 132 formed in the lower plate provide the by-products storage space together with the quadrangular rim collection plates 333 disposed in the dual structure, such that a predetermined amount of by-products may be accumulated, thereby further minimizing the outflow.

Meanwhile, fastening holes 331b are formed at the portions adjacent to the vertices of the third horizontal collection plate 331, and the upper-end rods 133b of the internal collection tower supports 133 penetrate the fastening holes 331b. Because the fastening hole 331b has a smaller diameter than the lower-end rod 133a of the internal collection tower support 133, the lower-end collection part is spaced apart from the lower plate of the housing by a height of the lower-end rod 133a of the internal collection tower support 133.

Therefore, the space portion in which the quadrangular rim collection plates 333 protruding downward from the third horizontal collection plate 331 are installed is ensured.

In this case, a height of the lower space of the third horizontal collection plate 331 is similar to a height of the quadrangular rim collection plate 333 because of a height of the lower-end rod 133a of the internal collection tower support 133, such that there is no unnecessary space between the lower plate and the lower-end inner collection part. Therefore, the spatial utilization of the collection apparatus is maximized, and a degree to which the by-products are discharged through the gas discharge port is minimized.

An operation of the present disclosure configured as described above will be described below.

The exhaust gas introduced into the inlet port of the housing 1, which constitutes the collection n apparatus for collecting the by-products contained in the components of the exhaust gas discharged from the process chamber, is guided to the heater main body 22 positioned below the heater cap 21 so that the exhaust gas is not dispersed to the periphery in a state in which the exhaust gas is not aggregated or heated at the introduction point.

Thereafter, the exhaust gas, which is heated by the heater main body 22, is distributed to the periphery by the heat radiating fins 23 and the quadrangular heater plate 24 and then flows downward.

Thereafter, as the exhaust gas flows through the internal collection tower 3 having the structure in which the collection regions are vertically divided into the upper-end collection part 31, the intermediate collection part 32, and the lower-end collection part 33, the collection reaction occurs at multiple stages by the smooth change in exhaust gas flow path and the collection structure.

Only the exhaust gas from which the by-products are removed by the collection reaction is discharged to the lower discharge port provided on the lower plate of the housing.

During this process of collecting the exhaust gas, the upper-end collection part 31 has the bent-type collection plate 313 having the open structure and configured to collect the by-products, such that the collection reaction occurs without hindering the introduction flow of the exhaust gas introduced into the central portion from the outer periphery, which improves the spatial efficiency. In the intermediate collection part 32, the by-products are mainly collected and accumulated by the height difference between the outer peripheral vertical blade plate 322 having the open gas flow structure of the inner region and the inner wall of the housing and the inner vertical blade plate 323 formed inward and the internal space structure using the height difference, such that the spatial efficiency is improved.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for collecting by-products for a semiconductor manufacturing process with improved collection space efficiency, which is installed in an exhaust line between a process chamber and a vacuum pump, the apparatus comprising:

a housing (1) configured to accommodate introduced exhaust gas discharged from the processor chamber and discharge the exhaust gas;

a heater (2) configured to heat and distribute the exhaust gas; and an internal collection tower (3) configured to collect by-products, wherein the internal collection tower (3) configured by an upper-end collection part (31), an intermediate collection part (32), and a lower-end collection part (33) provided on multiple stages and configured to collect the by-products while changing a flow path direction of the introduced exhaust gas by maximally using a limited space in the housing, such that the by-products are mainly collected by outer peripheral vertical blade plates (322) at an outer periphery having an open structure to allow gas to smooth flow between an inner region and an inner wall of the housing (1), the by-products are collected by the intermediate collection part (32) having inner vertical blade plates (323) and bottom plates (324) each having a lower height than the outer peripheral vertical blade plate (322), and then the by-products are accumulated in an internal space of the apparatus, wherein the upper-end collection part (31) comprises:

a quadrangular first horizontal collection plate (311) having a main gas hole (311a) and a plurality of auxiliary gas holes (311b, 311c) formed around the main gas hole (311a) and configured to collect the by-products while guiding the flow of the exhaust gas, which flows downward from the heater, to the central portion;

a plurality of triangular collection plates (312) arranged radially along an outer periphery of an upper surface of the first horizontal collection plate and configured to collect the by-products;

bent-type collection plates (313) provided at four edges of an upper surface of the first horizontal collection plate and protruding to be higher than the triangular collection plates, the bent-type collection plates (313) being configured to collect the by-products while having an open structure so as not to hinder the introduction flow of the exhaust gas; and fastening rods (314) protruding downward and corresponding to vertices of a bottom surface of the first horizontal collection plate, the fastening rods (314) being fastened and fixed to an internal collection tower supports (133), and wherein the bent-type collection plate (313) comprises:

a pair of support bodies (313a) provided at an outer periphery of the first horizontal collection plate; and a connection body (313b) configured to connect upper ends of the support bodies.

2. The apparatus of claim 1, wherein the triangular collection plates (312) each have a right-angled triangular shape having a vertical surface positioned adjacent to the central portion, and the triangular collection plates (312) are positioned above the plurality of auxiliary holes (311c) arranged along the outer periphery and fastened to intersect vertical plate pieces (312a).

3. The apparatus of claim 1, wherein the intermediate collection part (32) comprises:

a quadrangular second horizontal collection plate (321) having a main gas hole (321a) formed in a central portion of a surface thereof, and a plurality of auxiliary gas holes (321b) uniformly formed and quadrangularly arranged on the entire remaining surface thereof, the second horizontal collection plate (321) configured to collect the by-products while guiding the flow of the exhaust gas;

a plurality of outer peripheral vertical blade plates (322) arranged along an outer peripheral edge of an upper surface of the second horizontal collection plate and configured to collect the by-products with an installation structure opened so as not to block the flow of the exhaust gas between the inner wall of the housing and the inner region;

a plurality of inner vertical blade plates (323) protruding in an inner region of the upper surface of the second horizontal collection plate so as to be disposed at a height lower than the outer peripheral vertical blade plates (322), the plurality of inner vertical blade plates (323) being configured to collect the by-products;

bottom plates (324) protruding in a lattice shape in the inner region of the upper surface of the second horizontal collection plate so as to be disposed at a height lower than the inner vertical blade plates (323), the bottom plates (324) being configured to collect the by-products;

inclined plates (325) configured to intersect the outer peripheral vertical blade plates (322) in a horizontal direction and installed on multiple vertical stages, the inclined plates (325) being configured to collect the by-products while generating vortices; and spacing plates (326) protruding downward from a bottom surface of the second horizontal collection plate (321) and supported on the lower-end collection part, the spacing plates (326) being configured to collect the by-products while spacing the second horizontal collection plate (321) and the lower-end collection part at a predetermined interval.

4. The apparatus of claim 3, wherein the outer peripheral vertical blade plate (322) has a wide lower portion and a narrow upper portion, an outer portion directed toward the inner wall of the housing has a shape of a vertical right-angled triangular structure, and a surface of the outer peripheral vertical blade plate (322) is positioned in a transverse direction without being disposed to be directed toward the central portion so that an open structure is provided between the inner wall of the housing and an inner region of the intermediate collection part.

5. The apparatus of claim 3, wherein the inner vertical blade plates (323) are each configured to have a cross-shaped section and distributed and disposed so that an installation density decreases from the central portion of the second horizontal collection plate (321) toward the outer peripheral vertical blade plates (322) at the periphery.

6. The apparatus of claim 3, wherein the spacing plates (326) are installed on the bottom surface of the second horizontal collection plate (321) and protrude to have a "¬"-shaped cross-section so as to surround inward fastening holes (321C) formed at four portions adjacent to vertices, the spacing plates (326) support the intermediate collection part so that the intermediate collection part is spaced apart from the lower-end collection part, and the spacing plates (326) are configured to collect the by-products from the exhaust gas discharged through the fastening holes (321C).

7. The apparatus of claim 1, wherein the lower-end collection part (33) comprises:

a quadrangular third horizontal collection plate (331) having a plurality of gas holes (331a) formed along an outer periphery thereof and configured to collect the by-products while guiding the exhaust gas, which flows downward from the upper portion, to the outer periphery;

a plurality of quadrangular collection plates (332) disposed radially on an upper surface of the third horizontal collection plate and having a plurality of gas holes (332a) formed in a surface thereof, the plurality of quadrangular collection plates (332) being configured to collect the by-products while maximizing a contact surface with the exhaust gas while allowing the exhaust gas to be uniformly distributed; and quadrangular rim collection plates (333) provided on a bottom surface of the third horizontal collection plate and having a plurality of gas holes (333c) in a surface thereof, the quadrangular rim collection plates (333) disposed in a dual structure including outer periphery collection plates (333a) and inner collection plates (333b), which are provided in the form of a quadrangular rim, in order to allow the exhaust gas to be uniformly distributed, collect the by-products, and finally minimize a degree to which the by-products are discharged through the discharge port.

8. The apparatus of claim 1, wherein a storage groove portion (132) is formed in an upper surface of a lower plate (13) of the housing (1) so as to be lower than an upper end of the gas discharge port around a gas discharge port (131) in order to store the by-products, and wherein a plurality of internal collection tower supports (133), which each have a lower-end rod (133a) and an upper-end rod (133b) configured in a stepped manner, is provided on the lower plate (13), such that the upper-end collection part (31), the intermediate collection part (32), and the lower-end collection part (33), which constitute the internal collection tower (3), are vertically spaced apart from one another and configured on multiple stages.

9. The apparatus of claim 1, wherein the heater (2) comprises:

a heater cap (21) installed to communicate with a gas inlet port (121) provided in an upper plate of the housing and configured to supply the introduced gas to a lower heater main body (22);

a heater main body (22) configured to heat the exhaust gas, which flows downward from the upper portion, and distribute the exhaust gas in a transverse direction through heat radiating fins (23) disposed radially; and a quadrangular heater plate (24) configured to supply the exhaust gas, which is distributed from the heater main body (22), to the inner wall of the housing (1) at the outer periphery and allow the exhaust gas to flow downward and having a plurality of gas holes (24a) at a periphery thereof to allow the exhaust gas to be supplied to the inner wall of the housing at the outer periphery.

* * * * *